(12) United States Patent
Castex

(10) Patent No.: US 7,486,153 B2
(45) Date of Patent: Feb. 3, 2009

(54) CIRCUIT AND METHOD FOR CONTROLLING AN OSCILLATION LOOP

(75) Inventor: Franck Castex, Le Mans (FR)

(73) Assignee: NXP, B.V., Eindhoven (NL)

( * ) Notice: Subject to any disclaimer, the term of this patent is extended or adjusted under 35 U.S.C. 154(b) by 107 days.

(21) Appl. No.: 11/578,500

(22) PCT Filed: Apr. 4, 2005

(86) PCT No.: PCT/IB2005/051109

§ 371 (c)(1),
(2), (4) Date: Oct. 12, 2006

(87) PCT Pub. No.: WO2005/101646

PCT Pub. Date: Oct. 27, 2005

(65) Prior Publication Data

US 2007/0164827 A1 Jul. 19, 2007

(30) Foreign Application Priority Data

Apr. 13, 2004 (EP) .................................. 04300203

(51) Int. Cl.
*H03L 7/099* (2006.01)

(52) U.S. Cl. ..................... 331/185; 331/36 C; 331/158; 331/177 V

(58) Field of Classification Search ............... 331/36 C, 331/116 R, 116 FE, 116 M, 158, 176, 177 V, 331/185, 186

See application file for complete search history.

(56) References Cited

U.S. PATENT DOCUMENTS

| 5,030,928 | A | 7/1991 | Ho et al. |
| 5,777,524 | A | 7/1998 | Wojewoda et al. |
| 5,874,864 | A | 2/1999 | Muto et al. |
| 6,603,365 | B1 * | 8/2003 | Dotzler et al. ................. 331/74 |
| 2003/0058057 | A1 * | 3/2003 | Schmidt ....................... 331/175 |
| 2003/0132809 | A1 | 7/2003 | Chinnugounder et al. |

* cited by examiner

*Primary Examiner*—Robert Pascal
*Assistant Examiner*—Ryan J. Johnson
(74) *Attorney, Agent, or Firm*—Lisa K. Jorgenson; William J. Kubida; Hogan & Hartson LLP

(57) ABSTRACT

The circuit for controlling the oscillation frequency of an oscillation loop (66) has among others the following components—a first tunable capacitor unit (80) for providing a selectable amount of capacitance to the oscillator loop in accordance with a stored setting, and for controlling the oscillation frequency of the oscillator loop, and—a volatile storage unit (84) adapted to store the setting of the tunable capacitor unit. The circuit further comprises a supply line (52) to the volatile storage unit and at least one other supply line (44) for the other components of said circuit. The supply line to the volatile storage unit is independent of said at least one other supply line, so that the volatile storage unit can be powered independently of other components of said circuit.

10 Claims, 2 Drawing Sheets

CIRCUIT AND METHOD FOR CONTROLLING AN OSCILLATION LOOP

FIELD OF THE INVENTION

The present invention relates to a circuit, a method and a radio transceiver for controlling an oscillation loop, and a clock circuit and a mobile phone incorporating this circuit.

More precisely, the invention relates to a circuit for controlling the oscillation frequency of an oscillation loop, the circuit having among others the following components:

- a first tunable capacitor unit for supplying a selectable amount of capacitance to the oscillation loop in accordance with a stored setting, and for controlling the oscillation frequency of the oscillation loop, and
- a volatile storage unit adapted to store the setting of the tunable capacitor unit.

BACKGROUND OF THE INVENTION

Patent application US 2003/0132809 discloses a circuit for a real time clock of a computer. Typically, in the known circuit, all the components and in particular the volatile storage unit, are powered through a common supply line.

In situations where power consumption should be kept lowest possible, the power supply line of the circuit is cut off to save energy during the sleep mode. However, in the known circuit, the setting stored in the volatile storage unit is lost when the supply line is cut off. As a result, it is necessary to reload the setting in the volatile storage unit when the power is restored. Reloading the setting in the volatile storage unit each time the power is restored is a cumbersome process.

SUMMARY OF THE INVENTION

Accordingly, it is an object of the invention to provide a circuit for controlling the oscillation frequency of an oscillation loop where reloading the setting in the volatile storage unit after a power cut is facilitated.

The invention provides a circuit for controlling the oscillation frequency of an oscillation loop wherein the circuit comprises a supply line to the volatile storage unit and at least another supply line to the other components of said circuit, the supply line to the volatile storage unit being independent of said at least one other supply line, so that the volatile storage unit can be powered independently of other components of said circuit.

In the above circuit, it is possible to cut off the supply line to the energy consuming components of the circuit while maintaining the power supply to the volatile storage unit. As a result, it is possible to reduce the power consumption of the circuit while keeping the setting stored in the volatile storage unit. Thereafter, when the power supply to all the components of the circuit is restored, it is not necessary to reload the setting in the volatile storage unit. This makes reloading of the setting after power cuts unnecessary after a sleep mode.

Furthermore, since it is not necessary to reload the setting in the volatile storage unit during the restoration of the power supply, the process is faster.

A circuit, wherein the supply line to the volatile storage unit supplies only power to the volatile storage unit, has the advantages of maximizing the saving of power consumption.

A circuit which comprises a second tunable capacitor unit that has a temperature-sensitive element to automatically reduce changes in the oscillation frequency of the oscillation loop resulting from temperature variations has the advantage that it reduces the sensitivity of the oscillation frequency of the oscillation loop to account for temperature variations.

A circuit which comprises:

- an automatic frequency control module (92) adapted to tune the oscillation frequency of the oscillation loop in accordance with the frequency of a received radio signal, and
- a third tunable capacitor unit (90) adapted to supply a selectable amount of capacitance to the oscillation loop under the control of the automatic frequency control module, and has the advantage of making the claimed circuit suitable for use with radio transceivers.

The invention also relates to a clock circuit for a mobile phone comprising:

- an oscillation loop, and
- a power supply unit, wherein:

- the clock circuit further comprises a circuit for controlling the oscillation frequency of the oscillation loop according to the invention, and
- the power supply unit comprises at least two power outputs, one of which is connected to the supply line to the volatile storage unit and the other one is connected to the supply line to the other components of the circuit.

A circuit, wherein the power supply unit comprises a battery and a voltage regulator to supply a constant voltage on the output connected to the supply line to the volatile storage unit, has the advantage that it makes the clock circuit more reliable than other solutions based on a power storage capacitor.

A circuit where the oscillation loop comprises a crystal resonator, has the advantage that it makes the clock circuit more cost-effective to implement.

The invention also relates to a radio transceiver chip adapted to be used in a circuit as mentioned above, and a mobile phone comprising such a clock circuit.

The invention also relates to a method of controlling the oscillation frequency of an oscillation loop, the method comprising the steps of:

- tuning a tunable capacitor unit to supply a selectable amount of capacitance to the oscillation loop in accordance with a stored setting, to control the oscillation frequency of the oscillation loop, and
- loading the setting of the tunable capacitor unit in a volatile storage unit,
- wherein the method further comprises steps of cutting off the supply line to the other components needed to control the oscillation frequency of the oscillation loop and simultaneously continuing to supply power to the volatile storage unit simultaneously.

These and other aspects of the invention will be apparent from the following description, and from the claims.

DESCRIPTION OF PREFERRED EMBODIMENTS

Figure 1:
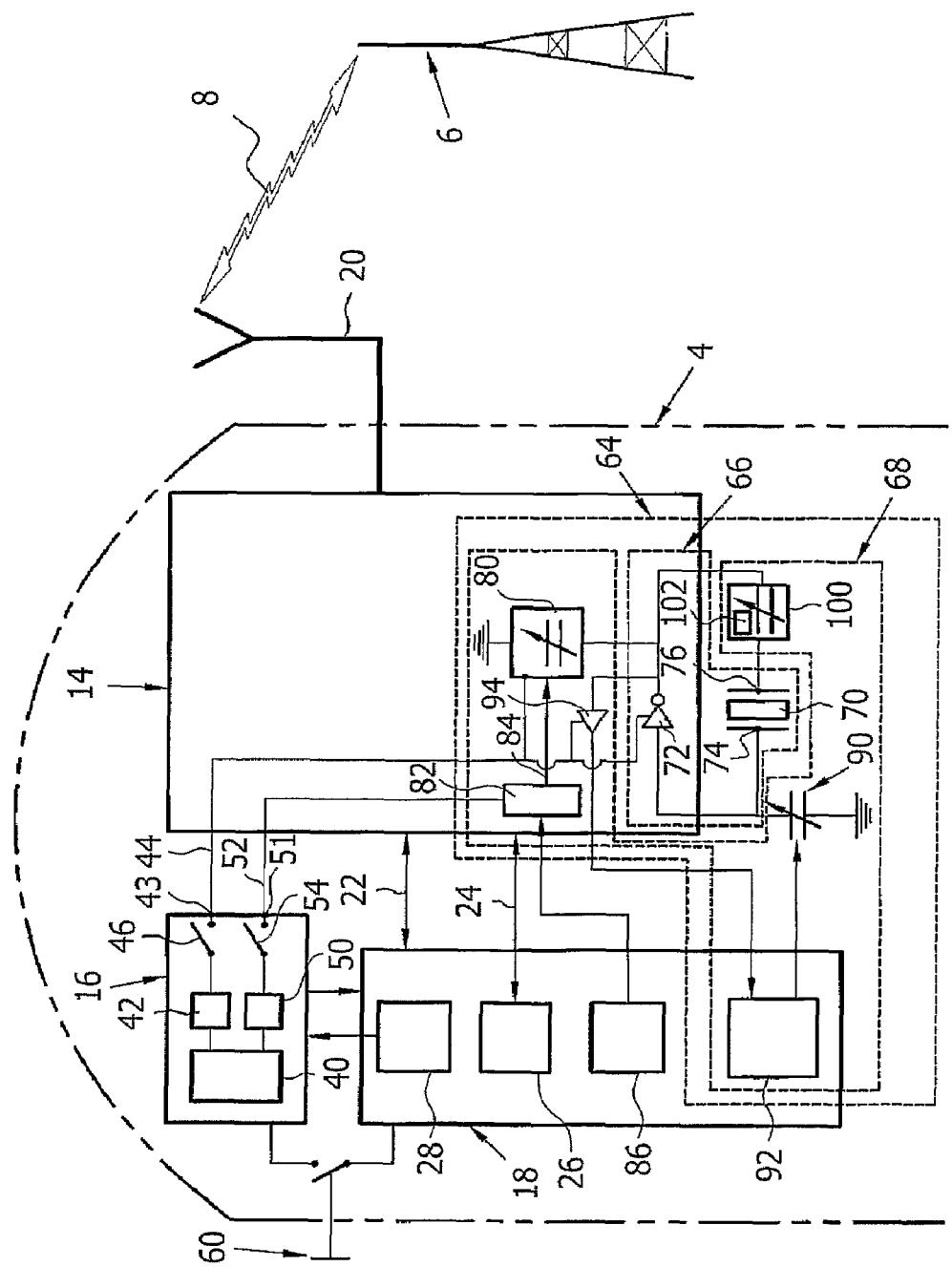
FIG. 1 is a schematic diagram of a mobile phone comprising a circuit for controlling the oscillation frequency of an oscillation loop according to the invention.

FIG. 1 shows part of a radio telecommunication apparatus 4. By way of illustration, the radio telecommunication apparatus is a GSM radio cellular mobile phone 4. Phone 4 is able to communicate with a base station 6 of a radio cellular phone network using radio signals 8. To do so, phone 4 implements a TDMA (Time Division Multiple Access) technique.

Base station 6 is equipped with a transmitter and a receiver to transmit and receive radio signals 8 from phone 4. Radio signals 8 are organized in frames of 1250 bits of information. To transmit or receive radio signals, base station 6 uses a reference frequency.

FIG. 1 shows only the details necessary to understand the invention.

To receive or transmit such radio signals, phone 4 comprises a tunable radio transceiver 14, a controllable power supply unit 16, and a baseband processor 18.

Transceiver 14 is connected to an antenna 20 to receive and transmit radio signals.

Transceiver 14 is able to convert a received radio signal into a baseband signal and viceversa. In other words, the main task of transceiver 14 is to remove a carrier from the radio signal or to add such a carrier to a baseband signal. To realize such a conversion, transceiver 14 also uses a reference frequency closest possible to the reference frequency of base station 6.

Baseband signals are exchanged between processor 18 and transceiver 14 through a line 22 connecting transceiver 14 to processor 18.

For setting or tuning transceiver 14, processor 18 is connected to transceiver 14 via a control bus 24. For example, the bus 24 is a three-wire bus used to transmit control messages called "telegraphs". Such telegraphs may be used to change a frequency channel of transceiver 14.

To transmit control messages on bus 24, processor 18 comprises a conventional transceiver control module 26.

Processor 18 also comprises a power monitoring module 28 to control the power supply unit 16. More particularly, module 28 is designed to automatically switch phone 4 to an idle mode when phone 4 is turned on but not in use. By idle mode is meant hereinafter a working mode in which power consumption of phone 4 is reduced as much as possible. Typically, during idle mode, phone 4 regularly shifts from a monitoring mode to a sleeping mode and back to the monitoring mode. During the monitoring mode, transceiver 14 is turned on to check if new messages sent by the base station 6 are to be received and processed by phone 4. During the sleeping mode, transceiver 14 is turned off to save power. For example, phone 4 shifts from the sleeping mode to the monitoring mode every 470 ms with a monitoring duration of 36.9 ms at the most.

Phone 4 may also be manually reactivated or awakened from the idle mode by the user of phone 4 by pressing a key.

Power supply unit 16 is adapted to supply power to every electronic component of the phone 4 such as transceiver 14 and processor 18. Typically, for mobile phones, power supply unit 16 comprises a rechargeable battery 40 connected to a voltage regulator 42. Regulator 42 regulates the output voltage of the battery in order to generate a constant voltage of, for example, 2.8 Volts. Power supply unit 16 has a first power output 43, which is connected to regulator 42 through a controllable switch 46. Switch 46 is under the control of module 28, so that a 2.8 Volts power supply can be switched on or off. The first power output is connected to an external power supply line 44.

Power supply unit 16 also comprises another voltage regulator 50 and a second power output 51 connected to regulator 50 through a controllable switch 54. Regulator 50 generates a lower constant voltage of, for example, 1.8 Volts. Switch 54 is under the control of module 28 to switch the 1.8 Volts power supply on or off. The second power output 51 is connected to an external supply line 52.

FIG. 1 shows only the supply lines necessary for the understanding of the invention.

Power supply unit 16 may be manually turned on or off using an on/off button 60.

To keep the reference frequency of transceiver 14 closest possible to the reference frequency of base station 6, phone 4 comprises a tunable clock circuit 64. Circuit 64 comprises an oscillation loop 66 to generate an oscillating signal and a circuit 68 for controlling the oscillation frequency of the oscillation loop.

Oscillation loop 66 comprises a 26 MHz crystal resonator 70 and an inverting amplifier 72. Resonator 70 and amplifier 72 are connected in series to form a loop.

More precisely, a terminal 74 of resonator 70 is connected to an input of the inverting amplifier 72, whereas another terminal 76 of resonator 70 is connected to an output of the inverting amplifier 72.

Resonator 70 is a stand-alone component located outside the transceiver 14 packaging.

Circuit 68 comprises a digitally tunable capacitor unit 80 and a volatile storage unit 82 to store the setting of unit 80 to tune the oscillation frequency of loop 66.

Unit 80 is, for example, a digitally tunable capacitor bank such as the one described in US 2003/0132809. One terminal of unit 80 is connected to ground and another terminal of unit 80 is directly connected to the output of the inverting amplifier 72 to provide a selectable amount of capacitance to oscillation loop 66.

Unit 80 is powered through supply line 44.

Volatile storage unit 82 stores the setting of capacitor unit 80. More precisely, storage unit 82 latches a set of control signals on a bus 84, which is connected to the digital control inputs of unit 80.

For example, storage unit 82 is a set of latches like the ones described in US 2003/0132809;

Storage unit 82 is powered through supply line 52, which is dedicated to this function.

Units 80 and 82 are on-chip units manufactured in the same chip as the one of transceiver 14. The term "on-chip" means that these components are manufactured on a semiconductor chip.

Processor 18 comprises a setting module 86 to initialize or restore the setting in storage unit 82. Setting module 86 is able to load a new setting in storage unit 82 each time the power supply on line 52 is restored.

Circuit 68 comprises a conventional tunable capacitor unit 90 associated with an automatic frequency control module 92 to keep the difference between the reference frequency of phone 4 and the reference frequency of base station 6 smallest possible.

Capacitor unit 90 is connected between terminal 74 and ground to provide a voltage controlled capacitance for the oscillator loop 66. Unit 90 is, for example, a stand-alone component independent of the transceiver packaging.

Module 92 is designed to tune capacitor 90 according to information on the received radio signal 8 and on the present oscillation frequency of loop 66. To receive information on the oscillation frequency of loop 66, one input of module 92 is connected to the output of amplifier 72 through a buffer amplifier 94. Amplifier 94 is manufactured on the chip of transceiver 14.

The algorithm implemented in module 92 is conventional. For example, such an algorithm is described in: Francis D.

Natali, "AFC Tracking Algorithms", IEEE Transactions on Communications, Vol.Com-32, No 8, Aug. 1984, pages 935-947.

Module 92 is implemented in processor 18.

Finally, to obviate oscillation frequency fluctuations due to temperature variations, circuit 68 comprises a temperature-variable capacitor unit 100 built with a temperature-sensitive element 102. Capacitor unit 100 is connected in series in loop 66 between the output of amplifier 72 and the terminal 76.

Temperature-sensitive element 102 is used to automatically compensate for oscillation frequency fluctuations due to temperature variations. For example, temperature-sensitive element 102 is a group of thermo-resistors.

Unit 100 is a stand-alone component.

Figure 2:
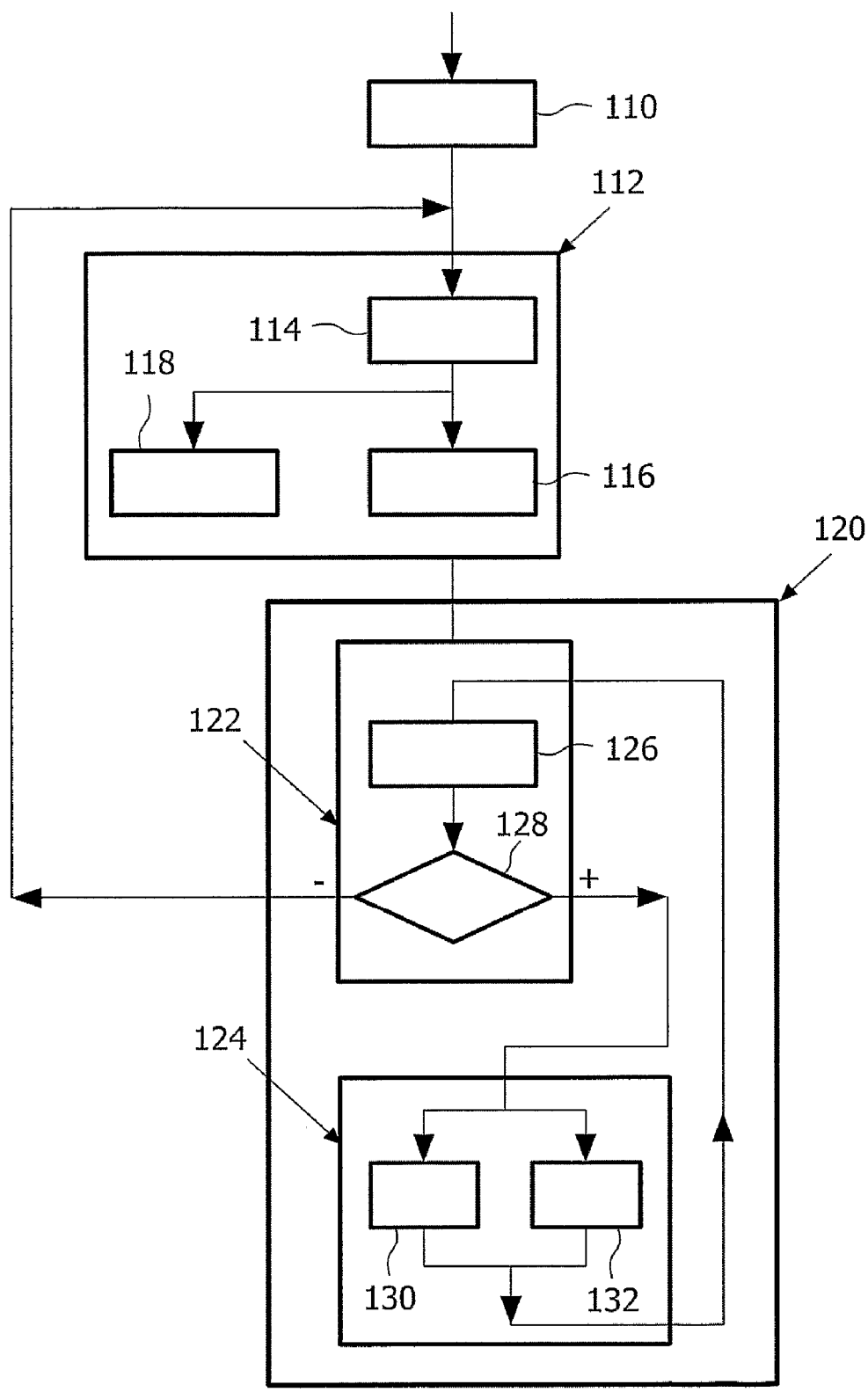
FIG. 2 is a flow chart of a method of controlling the oscillation frequency of an oscillation loop according to the invention.

The operation of phone 4 will now be described with reference to FIG. 2.

Initially, phone 4 is turned off and none of the components of phone 4 is supplied with power. Thus, the setting stored in storage unit 82 has been lost.

Thereafter, the user manually switches phone 4 on, using button 60. Processor 18 starts with an initialization stage 110 during which module 86 loads a new setting in storage unit 82.

Subsequently, processor 18 shifts to an active mode 112 during which every component is powered and ready for use. More precisely, during the active mode 112, switches 46 and 54 are closed, so that loop 66 and circuit 68 are powered.

In step 114, when circuit 68 is powered, the capacitance of unit 80 is selected according to the setting stored in storage unit 82 during the initialization stage. Therefore, oscillation loop 66 generates an oscillating signal according to the selected capacitance.

In step 116, still during the active mode 112, module 92 tunes capacitor unit 90 to keep the difference between the reference frequencies of phone 4 and base station 6 smallest possible.

In parallel, in a step 118 the oscillation frequency fluctuations of loop 66 are automatically compensated for by capacitor unit 100 and its associated temperature-sensitive element 102.

In the active mode 112, the user uses phone 4, for example, to make a call, to play or to manually update the phone configuration. During the active mode, the power consumption of clock circuit 64 is at a maximum since all of its components are powered.

To reduce power consumption, processor 18 automatically switches into an idle mode 120 if the user does not use phone 4 for a predetermined period of time. During the idle mode 120, processor 18 regularly alternates between a monitoring mode 122, and a sleeping mode 124.

During the monitoring mode 122, in a step 126, module 28 switches off or maintains the power supply to every component of phone 4 except the ones necessary to check if new radio signals are to be received. More particularly, during step 126, module 28 closes switch 46 and keeps switch 54 closed, so that the clock circuit 64 is fully powered and is able to generate the reference frequency necessary to receive radio signals.

In a step 128, if new radio signals are to be received, like in a telephone call, processor 18 automatically returns to the active mode 112. Otherwise, module 28 proceeds to the sleeping mode 124.

In the sleeping mode, in a step 130, module 28 opens switch 46 to reduce the power consumption of clock circuit 64.

However, in parallel, in a step 132, module 28 keeps switch 54 closed so that storage unit 82 is the only component of clock circuit 64, that remains powered. As a result, the setting stored in storage unit 82 is preserved while the power consumption of clock circuit 64 is reduced considerably.

Since the setting in storage unit 82 is not lost even during the sleeping mode, when returning to the monitoring mode or to the active mode, it is not necessary to reload the setting in storage unit 82. Therefore, the transition from the sleeping mode to the monitoring mode or the transition from the sleeping mode to the active mode is faster.

The use of a lower voltage to power storage unit 82 reduces the power consumption.

Furthermore, the use of a constant voltage to power storage unit 82 makes the circuit 68 more reliable. In another embodiment, the or a storage unit is powered by a capacitor, which is charged during the monitoring mode and discharged during the sleep mode. In this embodiment, regulator 50 is no longer necessary. However, a supplementary supply line is required to charge the capacitor.

Circuit 68 has been described in the particular case of a clock circuit for a mobile phone. However, circuit 68 can be used with other devices and pieces of equipment where saving power consumption is important. As an example, circuit 68 could be used in a computer. For such an application, capacitor unit 90 and module 92 are not needed.

Finally, if temperature compensation is not necessary, capacitor unit 100 may be omitted.

The invention claimed is:

1. A circuit for controlling the oscillation frequency of an oscillation loop, the circuit having among others the following components:
    a first tunable capacitor unit for supplying a selectable amount of capacitance to the oscillation loop in accordance with a stored setting, and for controlling the oscillation frequency of the oscillation loop, and
    a volatile storage unit adapted to store the setting of the tunable capacitor unit, wherein the circuit comprises a supply line to the volatile storage unit providing a voltage of a first voltage level through a first switch, and at least another supply line to the other components of said circuit providing a voltage of a second voltage level through a second switch, said second voltage level being greater than the first voltage level, the supply line to the volatile storage unit being independent of said at least one other supply line, so that the volatile storage unit can be powered, through corresponding switches, independent of other components of said circuit.

2. The circuit according to claim 1, wherein the power supply line of the volatile storage unit supplies power only to the volatile storage unit.

3. The circuit according to claim 1, wherein the circuit comprises a second tunable capacitor unit having a temperature-sensitive element to automatically reduce changes in the oscillation frequency of the oscillation loop resulting from temperature variations.

4. The circuit according to claim 1 wherein the circuit comprises:
    an automatic frequency control module adapted to tune the oscillation frequency of the oscillation loop in accordance with the frequency of a received radio signal, and
    a third tunable capacitor unit adapted to supply a selectable amount of capacitance to the oscillator loop under the control of the automatic frequency control module.

5. A clock circuit comprising:
    an oscillation loop, and
    a power supply unit, wherein: the clock circuit further comprises a circuit for controlling the oscillation frequency of the oscillation loop according to claim 1 and the power supply unit comprises at least two power outputs, of different voltage levels wherein a first voltage level is provided, via a supply line connected to a volatile storage unit and a second voltage level is provided via another supply line to the other components of the circuit, wherein the first voltage level is lower than the second voltage level, and is allied to the volatile storage unit in the absence of the second voltage level.

6. The clock circuit according to claim 5, wherein the power supply unit comprise a battery and a voltage regulator to supply a constant voltage on the output connected to the supply line to the volatile storage unit.

7. The clock circuit according to claim 5 wherein the oscillator loop comprises a crystal resonator.

8. A mobile phone, wherein the mobile phone comprises a clock circuit according to claim 5.

9. A radio transceiver chip adapted to be used in a circuit according to claim 1, the radio transceiver chip being adapted to convert radio signals into baseband signal and baseband signals to radio signals, wherein the radio transceiver chip comprises the first tunable capacitor unit and the volatile storage unit of said circuit.

10. A method of controlling the oscillation frequency of an oscillation loop, the method comprising the steps of:

tuning a tunable capacitor unit to provide a selectable amount of capacitance to the oscillation loop in accordance with a stored setting, to control the oscillation frequency of the oscillation loop, and loading the setting of the tunable capacitor unit in a volatile storage unit, wherein the method further comprises steps of providing a supply line to the volatile storage unit by supplying a voltage of a first voltage level through a first switch, providing at least another supply line to other components needed to control the oscillation frequency of the oscillation loop by supplying a voltage of a second voltage level through a second switch, said second voltage level being greater than the first voltage level, and cutting off the supply line to the other components needed to control the oscillation frequency of the oscillation loop while simultaneously continuing to supply power to the volatile storage unit.

* * * * *